(12) United States Patent
Ueno

(10) Patent No.: US 7,179,416 B2
(45) Date of Patent: Feb. 20, 2007

(54) HEAT TREATMENT APPARATUS

(75) Inventor: Hiroto Ueno, Kanagawa (JP)

(73) Assignee: Futek Furnace Inc., Kanagawa (JP)

( * ) Notice: Subject to any disclaimer, the term of this patent is extended or adjusted under 35 U.S.C. 154(b) by 0 days.

(21) Appl. No.: 11/198,463

(22) Filed: Aug. 5, 2005

(65) Prior Publication Data

US 2006/0022387 A1   Feb. 2, 2006

Related U.S. Application Data

(63) Continuation of application No. PCT/JP04/01241, filed on Feb. 6, 2004.

(30) Foreign Application Priority Data

Feb. 10, 2003 (JP) ............................... 2003-032933

(51) Int. Cl.
  *C21D 9/62* (2006.01)
(52) U.S. Cl. .................. 266/104; 219/411; 219/390
(58) Field of Classification Search ................ 266/104; 219/411, 390
See application file for complete search history.

(56) References Cited

U.S. PATENT DOCUMENTS

| | | |
|---|---|---|
| 6,181,535 B1 | 1/2001 | Araki et al. |
| 6,303,908 B1 | 10/2001 | Yamaga et al. |
| 2002/0151154 A1 | 10/2002 | Yamazaki et al. |
| 2002/0182557 A1 | 12/2002 | Kuriyama et al. |
| 2003/0010775 A1* | 1/2003 | Kim ........................... 219/634 |
| 2005/0023266 A1 | 2/2005 | Fugua |

FOREIGN PATENT DOCUMENTS

| | | |
|---|---|---|
| CN | 02105276 X | 1/2003 |
| DE | 102 16 865 A1 | 12/2002 |
| JP | 11-259825 A | 9/1999 |
| JP | 2000-182956 A | 6/2000 |
| JP | 2001-135543 A | 5/2001 |
| JP | 2002-353226 A | 12/2002 |
| JP | 2003-23191 A | 1/2003 |
| WO | WO 03/071589 A1 | 8/2003 |

* cited by examiner

*Primary Examiner*—Scott Kastler
(74) *Attorney, Agent, or Firm*—Akin Gump Strauss Hauer & Feld, LLP

(57) ABSTRACT

In a heat treatment apparatus, the direction of the magnetic field generated by the magnetic field generating device in the region in which the object of treatment is heat-treated and the conveying direction of the conveying device in which the object of treatment is conveyed into the heat treatment vessel are in parallel with each other, and are in parallel with the horizontal direction of the entire heat treatment apparatus. The object of treatment is heat-treated with the main surface thereof arranged in parallel with the direction of the magnetic field generated by the magnetic field generating device in the heat treatment region.

6 Claims, 11 Drawing Sheets

HEAT TREATMENT APPARATUS

CROSS-REFERENCE TO RELATED APPLICATIONS

This application is a continuation of International Application No. PCT/JP2004/001241, filed Feb. 6, 2004, which was published in the Japanese language on Aug. 19, 2004, under International Publication No. WO 2004/070747 A1, and the disclosure of which is incorporated herein by reference.

BACKGROUND OF THE INVENTION

The present invention relates to a heat treatment apparatus and a heat treatment method for carrying out a heat treatment in a magnetic field. More specifically, the invention relates to a heat treatment apparatus for applying a heat treatment in a high magnetic field to a finely patterned material or magnetic material, particularly a magnetic material such as an MR film, a GMR film or a TMR film.

A magnetic film, such as a thin film of an Fe—Ni, Pt—Mn or Co—Fe alloy or the like, formed on a substrate by sputtering or the like, which is a magnetic material used for a magnetic head, an MRAM (Magnetic Random Access Memory) which is one of non-volatile memories or the like, can exhibit its magnetic properties by subjecting it to a heat treatment in a high magnetic field.

For this purpose, there is conventionally proposed a heat treatment apparatus in which an electric furnace, an induction heating furnace or the like is disposed to apply a heat treatment in a magnetic field formed with electromagnets or permanent magnets. A schematic configuration of a typical conventional heat treatment apparatus is illustrated in FIG. 10.

As shown in FIG. 10, a heat treatment apparatus 1A has a cylindrical vacuum vessel 2 serving as a heat treatment vessel, a holding device 3 which holds an object to be heat-treated such as a magnetic material (hereinafter referred to as the "object of treatment") in the vacuum vessel 2, and a magnetic field generating device 20 arranged outside the vacuum vessel 2. The holding device 3 has a holder 3A which holds the object of treatment and a holder supporting unit 3B which supports the holder 3A and has a lid member 4 for opening/closing an upper opening of the vacuum vessel 2. Namely, the holder supporting unit 3B is arranged above the vacuum vessel 2, and the holder 3A holding the object of treatment is charged into the vessel by this supporting unit 3B.

The magnetic field generating device 20 is provided with a pair of electromagnets 21 arranged oppositely outside the vacuum vessel 2, and the electromagnet 21 has a magnetic core 22 and a coil 23.

A heating device 100 is provided between the outer surface of the vacuum vessel 2 and the end face of the magnetic core 22 of the electromagnet 21. Usually, the heating device 100 is spaced apart from the outer surface of the vacuum vessel 2 by a prescribed distance, and comprises an electric heater 101 arranged so as to surround the outer peripheral surface of the vacuum vessel 2. The electric heater 101 is configured as shown in the drawing, for example. That is, a spiral groove 103, for example, is provided on the inner peripheral surface of a heater support 102 facing the outer peripheral surface of the vacuum vessel. The heater support 102 is made of bricks or ceramics, and arranged so as to surround the vacuum vessel 2. And, a heating wire such as a nichrome wire 104 is positioned in the groove 103. A heat insulator 105 such as alumina felt or bricks is arranged on the outer peripheral surface of the heater support 102, so that the heat of the heating device 100 is not transferred to the electromagnets 21.

The heat-treated object is taken up from the vacuum vessel 2. Then, a new object of treatment is held by the holder 3A, charged by the supporting unit 3B into the vacuum vessel 2 from above, and subjected to the above-mentioned heat treatment. Subsequently, the heat treatment of the object of treatment is continued by batch treatment with the same procedure.

In the conventional heat treatment apparatus 1A, since a magnetic material or the like as the object of treatment has a large weight, the upper end of the vacuum vessel 2 has an opening, and the object of treatment is charged into, and discharged from, the vacuum vessel 2 through this opening.

According to the results of studies and experiments carried out by the present inventor, although the heat treatment apparatus 1A having the above-mentioned configuration is configured so as to carry out a heat treatment in a dust-free environment, deposition of dust onto the object of treatment was observed.

Further studies were carried out to solve this problem, and the results revealed the following. The conventional heat treatment apparatus 1A has the supporting unit 3B, and in addition, although not shown in FIG. 10, a moving device, such as a lift mechanism having a driving motor for vertically moving the supporting unit 3B, arranged above the object of treatment held by the holder 3A and the vacuum vessel 2. Upon operation, therefore, dust produced from the supporting unit 3B and the moving device adheres directly to the object of treatment or further intrudes into the vacuum vessel 2 to deposit onto the object of treatment during the heat treatment.

In order to prevent generation of dust from the holder supporting unit 3B and the moving device, therefore, it is necessary to extensively make efforts to eliminate dust from the entire apparatus, and this requires a more complicated and larger-scaled apparatus structure. This results in a larger space for installation of the apparatus and in a lower degree of freedom in the apparatus arrangement.

The present inventor therefore proposed, in Japanese Patent Application No. 2002-48634, a heat treatment apparatus in which it is hard for dust to adhere to the object of treatment, and a heat treatment method therefor.

More specifically, as shown in FIG. 11, a treatment chamber 50 for charging and discharging the object of treatment into and from the vacuum vessel 2 is arranged under the vacuum vessel 2. The object of treatment is moved up and down by the moving device 10 via the holder supporting unit 3B and the holder 3A, thereby the object of treatment displaces between the heat treatment vessel 2 and the treatment chamber 50.

The above-mentioned configuration in which the moving device 10 for moving the object of treatment and the like are arranged below the vacuum vessel 2, provides advantages in making it difficult for dust to adhere to the object of treatment.

On the other hand, with respect to objects of treatment, magnetic material wafers, for example, 8-inch-sized (having a diameter of about 200 mm) wafers are commonly used at present, as the wafers to be charged into the heat treatment apparatuses. Recently, however, there is an increasing demand for larger wafers, that is, 12-inch-sized (diameter of about 300 mm) wafers.

When using the heat treatment apparatus having a so-called vertical tubular furnace as shown in FIG. 11, it is of course necessary to increase the diameter of the heat treatment vessel 2 sufficiently to house 12-inch-sized wafers. However, in this case, the magnetic field generating device 20 for generating the magnetic field having the field direction perpendicular to the longitudinal direction of the furnace core tube, i.e., a pair of electromagnets becomes larger in size. Also, when maintaining treatment number of wafers as in the conventional art, the magnet should further be increased in size.

This inevitably leads to a largely increased total height of the heat treatment apparatus and an increased weight of the electromagnet, along with the increase in size of the magnet. The base supporting the magnet must also necessarily have a larger and stronger structure.

The installation area and the volume of the heat treatment apparatus are therefore increased. As a result, it is very difficult or even impossible to install and use the apparatus in a conventional clean room, thus requiring construction of a new clean room of special specifications.

BRIEF SUMMARY OF THE INVENTION

An object of the present invention is therefore to provide a heat treatment apparatus which permits simplifying the configuration of the magnetic field generating device by using a compact solenoid type magnet (air-core coil), thereby permitting saving of the weight and height of the apparatus, reducing the installation area to the same order as the conventional one, achieving an apparatus installable in a usual clean room, and treating a large quantity of large-sized objects of treatment as compared with conventional art.

The above-mentioned object of the invention is achieved by the heat treatment apparatus of the present invention. In summary, the present invention provides a heat treatment apparatus comprising a holding device which holds an object of treatment, a heat treatment vessel which houses the object of treatment held by the holding device, a conveying device which conveys the holding device together with the object of treatment into the heat treatment vessel, a heating device which heats the object of treatment, and a magnetic field generating device which impresses a magnetic field onto the object of treatment;

wherein the direction of the magnetic field generated by the magnetic field generating device in a region in which the object of treatment is heat-treated and the conveying direction of the conveying device in which the object of treatment is conveyed into the heat treatment vessel are in parallel with each other, and are in parallel with the horizontal direction of the entire heat treatment apparatus; and wherein the heat treatment is carried out so that the main surface of the object of treatment is in parallel with the direction of the magnetic field generated by the magnetic field generating device in the heat treatment region.

According to an embodiment of the present invention, the object of treatment is one which deteriorates in an open-air atmosphere at a heat treatment temperature, and the heat treatment vessel can be set to contain a non-oxidizing atmosphere.

According to another embodiment of the present invention, the non-oxidizing atmosphere in the heat treatment vessel is a vacuum, a nitrogen atmosphere, or an argon atmosphere.

According to still another embodiment of the present invention, the heating device and the magnetic field generating device are arranged so as to surround the heat treatment vessel.

According to further another embodiment of the present invention, the heating device is an electric heater having a dual-wire structure, so that the magnetic field generated from the electric heater does not inhibit the magnetic field generated by the magnetic field generating device.

According to further another embodiment of the present invention, the magnetic field generating device is a DC normal conducting type electromagnet, DC superconducting type electromagnet, or a permanent magnet.

According to further another embodiment of the present invention, the magnetic field generating device is a solenoid type magnet.

According to further another embodiment of the present invention, a cooling device is provided between the magnetic field generating device and the heating device, so that the surface temperature of the magnetic field generating device in the region in which the magnetic field generating device and the heating device are close to each other does not exceed 50° C.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings.

DETAILED DESCRIPTION OF THE INVENTION

The heat treatment apparatus of the present invention will now be described further in detail with reference to the drawings.

Figure 1:
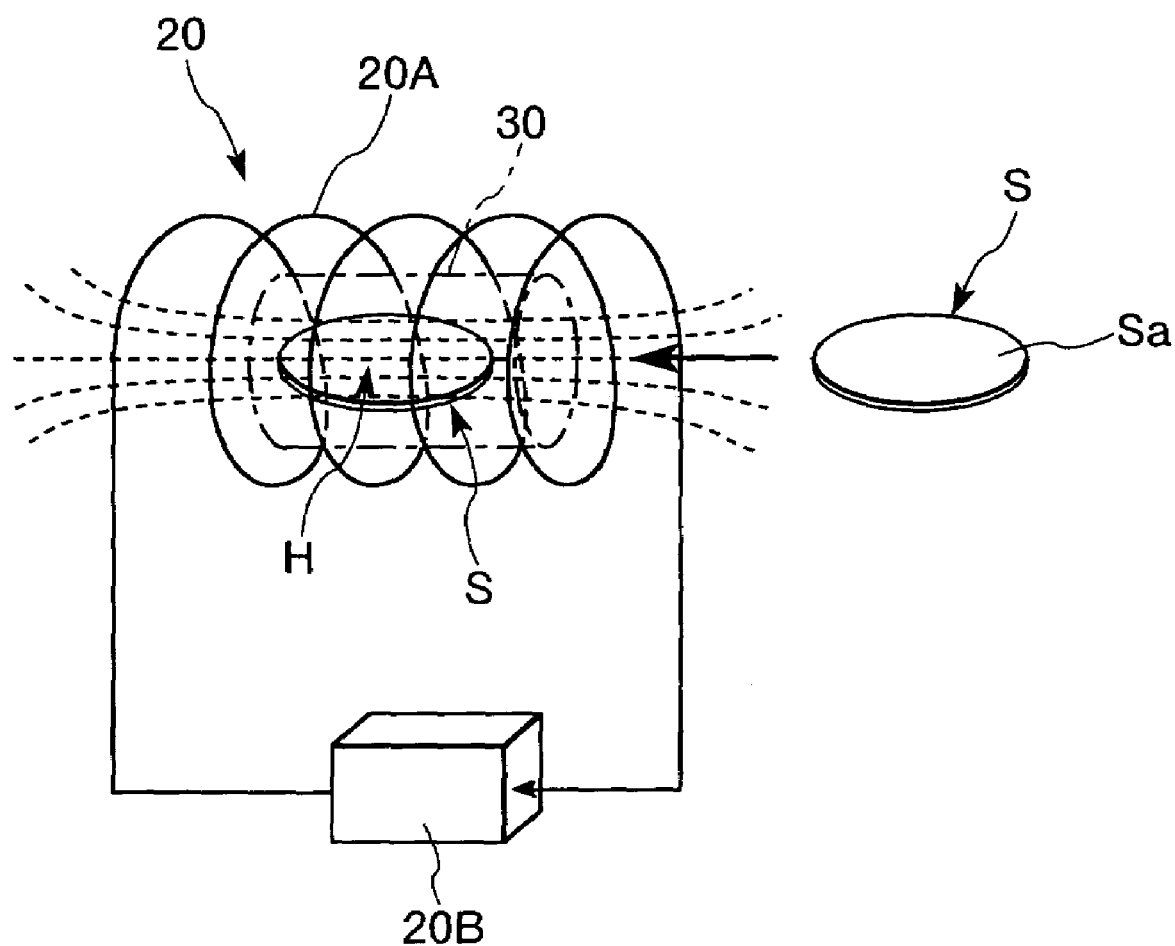
FIG. 1 is a schematic configuration view for illustrating the basic principle of the heat treatment apparatus of the present invention.

To begin with, the basic configuration of the heat treatment apparatus of the present invention will be described with reference to FIG. 1.

According to the present invention, a solenoid type magnet, i.e., an air-core coil 20A is used as a magnetic field generating device 20, and an object of treatment S which is a magnetic material is located at the center thereof. The air-core coil 20A is arranged so that the longitudinal center axis line direction thereof is substantially horizontal, and connected to the power source 20B. Relative to the object of treatment S located within the coil, the air-core coil 20A can impress a uniform magnetic field H in parallel with the main surface Sa of the object of treatment S. The object of treatment S is conveyed in the longitudinal axis line direction of the air-core coil 20A, and charged into the interior of the coil.

In the air-core coil 20A, a heating device 30 is arranged along the inner periphery of the air-core coil 20A, and can heat the object of treatment S to a prescribed temperature.

That is, with the above-mentioned configuration, the object of treatment S is heat-treated under the uniform magnetic field H.

Figure 2:
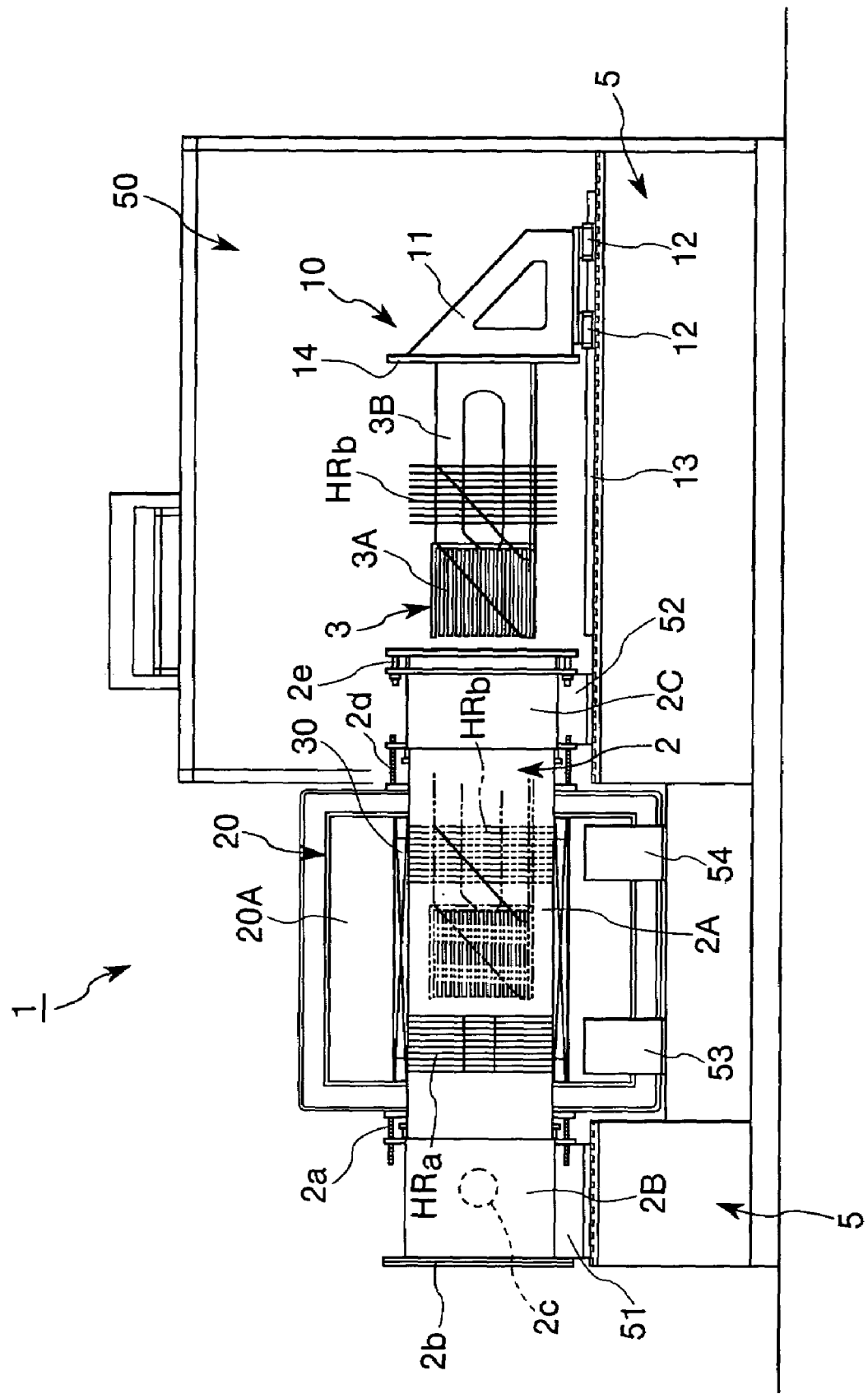
FIG. 2 is a schematic configuration sectional front view of an embodiment of the heat treatment apparatus of the present invention.
Figure 3:
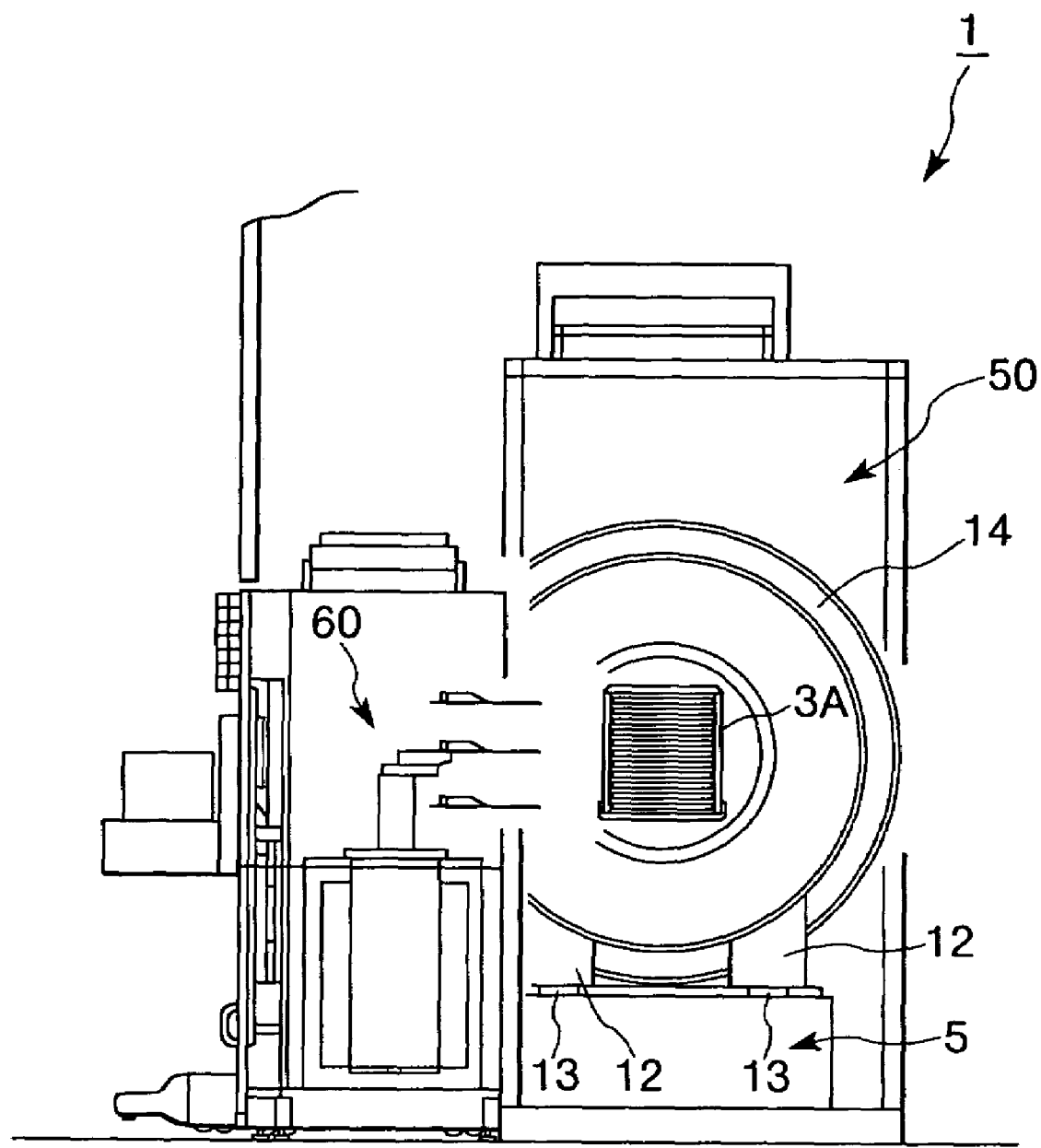
FIG. 3 is a schematic configuration sectional side view of an embodiment of the heat treatment apparatus of the present invention.
Figure 4:
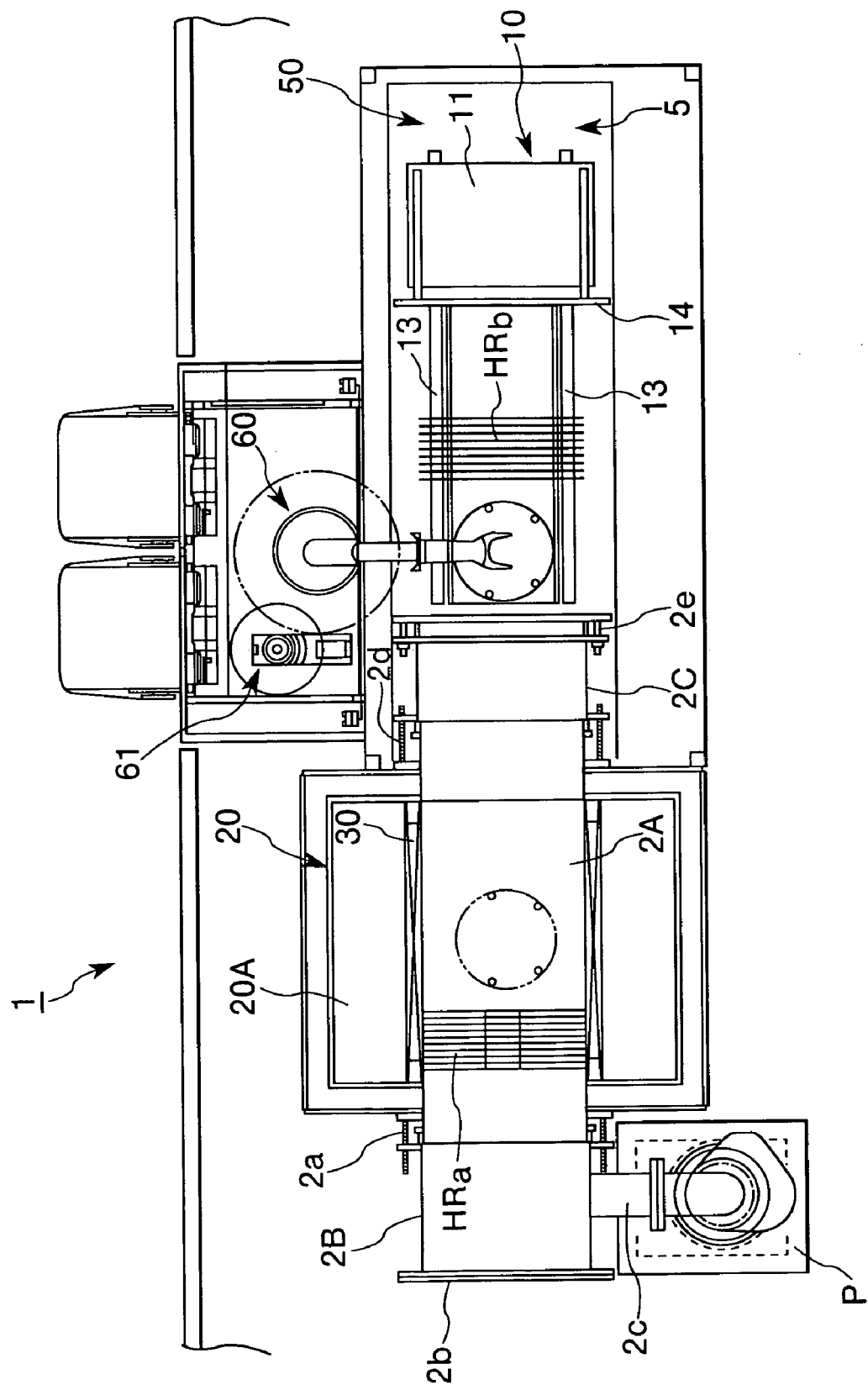
FIG. 4 is a schematic configuration sectional plan view of an embodiment of the heat treatment apparatus of the present invention.

An embodiment of the heat treatment apparatus of the present invention embodying the above-mentioned configuration will now be described. FIGS. 2 to 4 illustrate a schematic whole configuration of an embodiment of the heat treatment apparatus 1 of the present invention.

According to this embodiment, the heat treatment apparatus 1 comprises a vacuum vessel 2 serving as a heat treatment vessel arranged so that the longitudinal axial line thereof is horizontal, a holding device 3 which holds the object of treatment S, and a conveying device 10 which conveys the holding device 3 and the object of treatment S into and from the vacuum vessel 2.

In this embodiment, the vacuum vessel 2 has a vessel main body 2A which is substantially cylindrical. At the end portion positioned at the left-hand side in FIG. 2 which is an end of the vessel main body 2A, there is arranged a closed end member 2B which is a cylindrical member arranged coaxially with the vessel main body 2A. The closed end member 2B may be integral with the vessel main body 2A, but is separated from the vessel main body 2A in this embodiment. An end of the closed end member 2B is integrally connected to the vessel main body 2A by means of a sealing connector 2a, and a closed cover 2b is attached to the other end of the closed end member 2B.

At a position adjacent the above-mentioned closed cover 2b of the closed end member 2B, a conduit 2c for introducing a non-oxidizing gas, in this embodiment, is connected via a valve (not shown) to a vacuum pump P (see FIG. 4).

At the end portion positioned at the right-hand side in FIG. 2 which is the other end of the vessel main body 2A, there is arranged an open end member 2C which is a cylindrical member arranged coaxially with the vessel main body 2A. The open end member 2C may be integral with the vessel main body 2A, but is separated from the vessel main body 2A in this embodiment. An end of the open end member 2C is integrally connected to the vessel main body 2A by means of a sealing connector 2d. At the opening of the other end of the open end member 2C, a fixture 2e is provided for sealing the vacuum vessel 2 by its engagement with a cover member 14 provided on the conveying device 10.

The above-mentioned closed end member 2B and open end member 2C are secured to the apparatus rack, i.e., the lower structure 5 by means of attachments 51 and 52, respectively. The vacuum vessel 2 is thus horizontally installed relative to the entire apparatus.

The holding device 3 comprises a plurality of boats 3A arranged at prescribed intervals, so as to hold the objects of treatment S horizontally and to permit stacking a prescribed number of the objects of treatment S in the vertical direction, and an arm-shaped boat supporting unit 3B which supports the boats 3A. The other end side of the boat supporting unit 3B opposite to the side supporting the boats 3A extends horizontally and is connected to the conveying device 10.

The conveying device 10 has a base 11 to which the above-mentioned boat supporting unit 3B is integrally secured. In this embodiment, the base 11 has a sliding member 12 thereunder. This sliding member 12 slides in and engages with a guide rail 13 provided on the lower structure 5, whereby the base 11 is movable along the longitudinal axis line of the vacuum vessel 2, i.e., in the horizontal direction as viewed from the apparatus as a whole.

The base 11 of the conveying device 10 has the cover member 14. Upon charging the boats 3A into the vacuum vessel 2, the cover member 14 is secured to the fixture 2e of the vacuum vessel 2, and hermetically seals the vacuum vessel opening.

More specifically, at least the main body portion 2A of the vacuum vessel 2 should preferably be made of ceramics such as quartz glass for its stability during rapid cooling. In this embodiment, the closed end member 2B and the open end member 2C are also made of quartz glass like the main body portion 2A.

In this embodiment, as described later in detail, heating in vacuum by the heating device 30 is accomplished mainly by radiation heat. The quartz glass should therefore preferably be an optically transparent one. The vacuum vessel 2, which may have a thickness within a range of from 2 to 8 mm, has a thickness of 6 mm in this embodiment.

The holding device 3 comprises about 30 boats 3A each for mounting a substrate (wafer) having a diameter of from about 100 to 300 mm and having an Fe—Ni alloy film formed by sputtering, for example. The boats 3A are supported by a supporting shaft (not shown). The lower end of the supporting shaft is connected to and supported by the boat supporting unit 3B.

Each boat 3A is constructed, as described above, so as to be able to load the object of treatment S horizontally and to stack the same in the vertical direction.

By horizontally arranging the object of treatment S as described above, it is possible to more stably place and hold the object of treatment S on the boat 3A than in the vertical arrangement, permitting avoidance of inclination or moving of the object of treatment S during the heat treatment on the boat 3A. The risk of deformation of the object of treatment S during the heat treatment can therefore be efficiently avoided.

The conveying device 10 conveys the holding device 3 into the vacuum vessel 2. The cover member 14 of the conveying device 10 is attached to the vacuum vessel opening fixture 2e, and the vacuum vessel 2 is sealed. Thereafter, the interior of the vacuum vessel 2 can be maintained in a prescribed vacuum state by evacuating the vacuum vessel 2 by means of a vacuum pump P communicating with the vacuum vessel closed end member 2B. For example, when the object of treatment is a magnetic metal thin film, the object of treatment should preferably be heat-treated in vacuum, or more specifically, in a vacuum of less than or equal to 1 Pa to avoid oxidation of the metal thin film. Or, the heat treatment may also be carried out in a prescribed atmosphere. The interior of the vacuum vessel 2 may be filled with a non-oxidizing gas such as nitrogen gas or argon gas via the above-mentioned conduit 2c to achieve a non-oxidizing gas atmosphere in the vacuum vessel 2.

According to the present invention, the magnetic field generating device 20 is arranged so as to surround the outer periphery of the cylindrical vacuum vessel 2, or more particularly, to surround the outer periphery of the vacuum vessel main body 2A. As described above with reference to FIG. 1, the magnetic field generating device 20 is the air-core coil, i.e., the solenoid type magnet 20A which is configured so as to be wound around the vacuum vessel 2. This magnetic field generating device 20 is secured to the lower structure 5 with attachments 53 and 54 as shown in FIG. 2. The magnet 20A is connected to the power source 20B. When the power source 20B is turned on, the uniform magnetic field H in parallel with the longitudinal axial line direction of the vacuum vessel 2 is generated in the vacuum vessel 2.

According to this embodiment, as described further in detail later, the heating device 30 is arranged between the outer peripheral surface of the vacuum vessel 2 and the inner peripheral surface of the magnet 20A. Also, according to this embodiment, the thickness of the heating device 30 can be reduced. As a result, in this embodiment, the density of the magnetic field generated by the magnetic field generating device 20 can be 0.05 tesla or more, or more particularly, within a range from 0.1 to 5 tesla.

The heating device will now be described.

Figure 5:
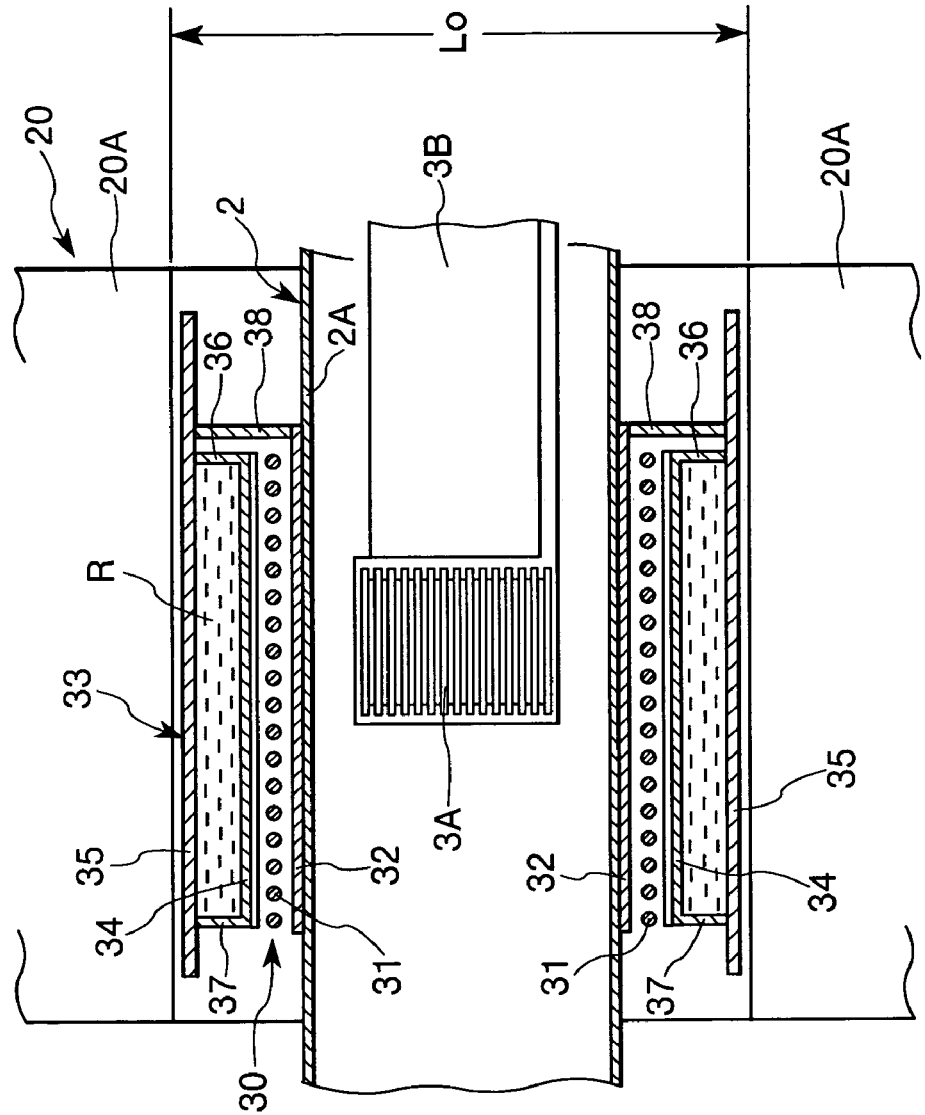
FIG. 5 is a partial sectional view illustrating the layout relationship of a vacuum vessel, a heating device and an electromagnet.
Figure 6:
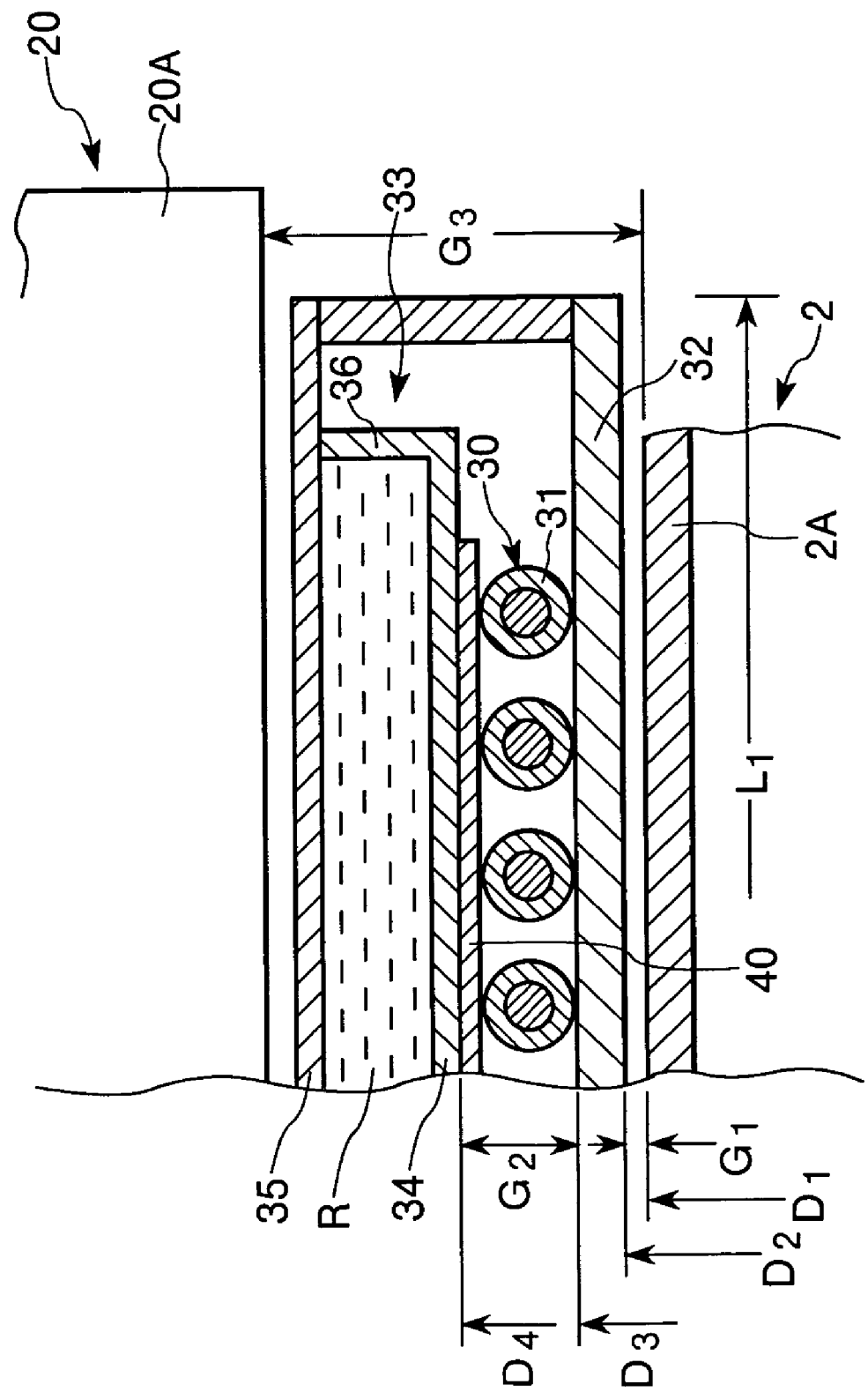
FIG. 6 is a partially enlarged sectional view of the heating device.

As will be understood by referring to FIGS. 5 and 6, according to this embodiment, the thin cylindrical heating device 30 is provided between the outer peripheral surface of the vacuum vessel main body 2A and the inner peripheral surface of the coil 20A. There is provided an electric heater 31 based on electric-resistance heating as the heating device 30. The heating device 30 is not limited to this type. However, such a heating device 30 is preferable because of the low cost as compared with an induction heating device requiring an expensive power source.

More specifically, the heating device 30 has an electrically insulating inner cylinder 32 arranged so as to surround the outer peripheral surface of the vacuum vessel main body 2A, and a water-cooled jacket 33 forming a cooling device spaced apart from the inner cylinder 32 by a prescribed distance. The inner cylinder 32 can be manufactured from a quartz glass tube having a thickness of from 2 to 6 mm. A gap (G1) of from 2 to 4 mm is provided between the inner cylinder 32 and the outer peripheral surface of the vacuum vessel main body 2A. In this embodiment, in which the vacuum vessel main body 2A has an outside diameter (D1) of 240 mm, the inner cylinder 32 has an inside diameter (D2) of 245 mm. The inner cylinder 32 has an axial direction length (L1) of 450 mm.

The water-cooled jacket 33 is a cylinder having a dual-tube structure with an inner wall 34 and an outer wall 35, with both ends closed by walls 36 and 37, respectively. In this embodiment, as shown in the drawings, the outer wall 35 is extended beyond the inner wall 34 in the axial direction, and an annular supporting plate 38 is integrally secured to a extension on a side, in this embodiment, on the open end side of the vacuum vessel 2 (i.e., upper right of the drawings) to support the inner cylinder 32.

Although not shown, a water supply port and a water discharge port are formed in the water-cooled jacket 33, through which a cooling fluid R which is usually water is supplied. The cooling fluid R may be circulated.

Figure 7:
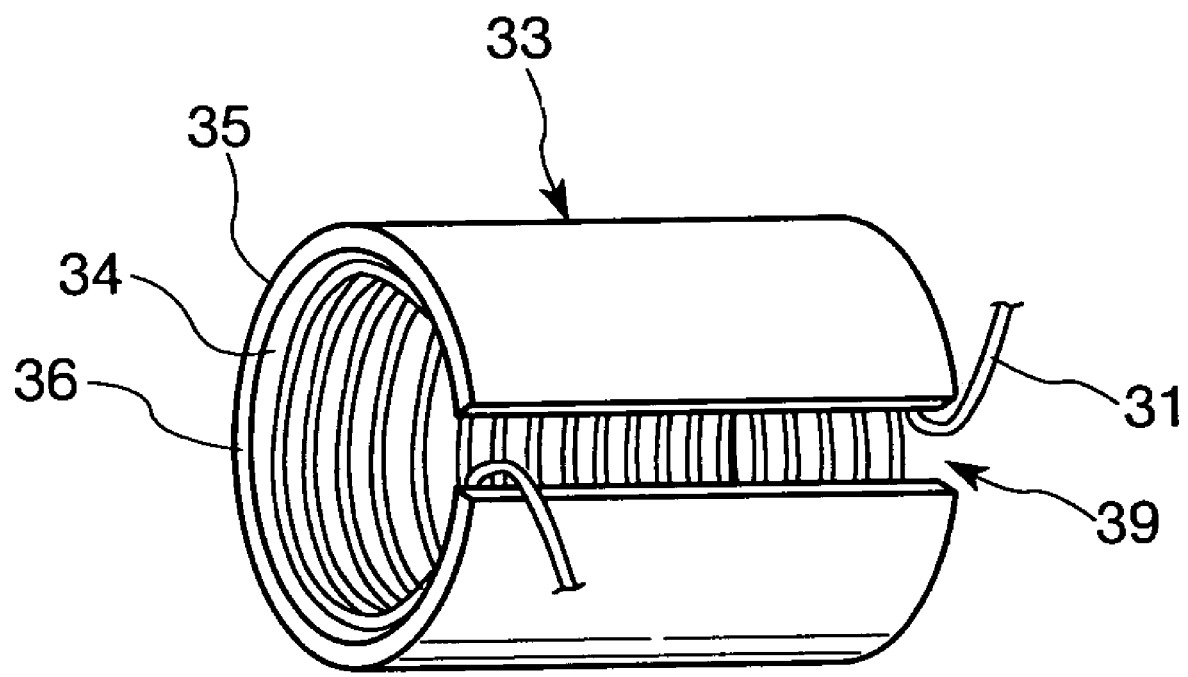
FIG. 7 is a perspective view illustrating the whole view of an embodiment of a water-cooled jacket.

As shown in FIG. 7, the water-cooled jacket 33 may be formed so as to have a slit 39 extending in the axial direction, not in a continuous cylindrical form in the circumferential direction. In this case, it is possible to take out a terminal of the heater 31 installed in the water-cooled jacket 33 by using the slit 39.

The water-cooled jacket 33 is made of a material having a high thermal conductivity such as a metal. In this embodiment, the inner wall 34, the outer wall 35, and the both end walls 36 and 37 and the like are manufactured with stainless steel plates having a thickness of 3 mm.

Referring to FIG. 6, a gap (G2) of from 8 to 13 mm for arranging the heater 31 is provided between the inner surface of the inner wall 34 of the water-cooled jacket 33 surrounding the inner cylinder 32 and the inner cylinder 32. In this embodiment, in which the inner cylinder 32 has an outside diameter (D3) of 253 mm, the water-cooled jacket 33 has an inside diameter (D4) of 272 mm. The inner wall 34 of the water-cooled jacket 33 has an axial direction length sufficient to completely cover the heating device 30.

The heating device 30 will be described further. The heating device 30 has the electric heater 31, as described above, and is spirally wound around the outer periphery of the inner cylinder 32.

Figure 8:
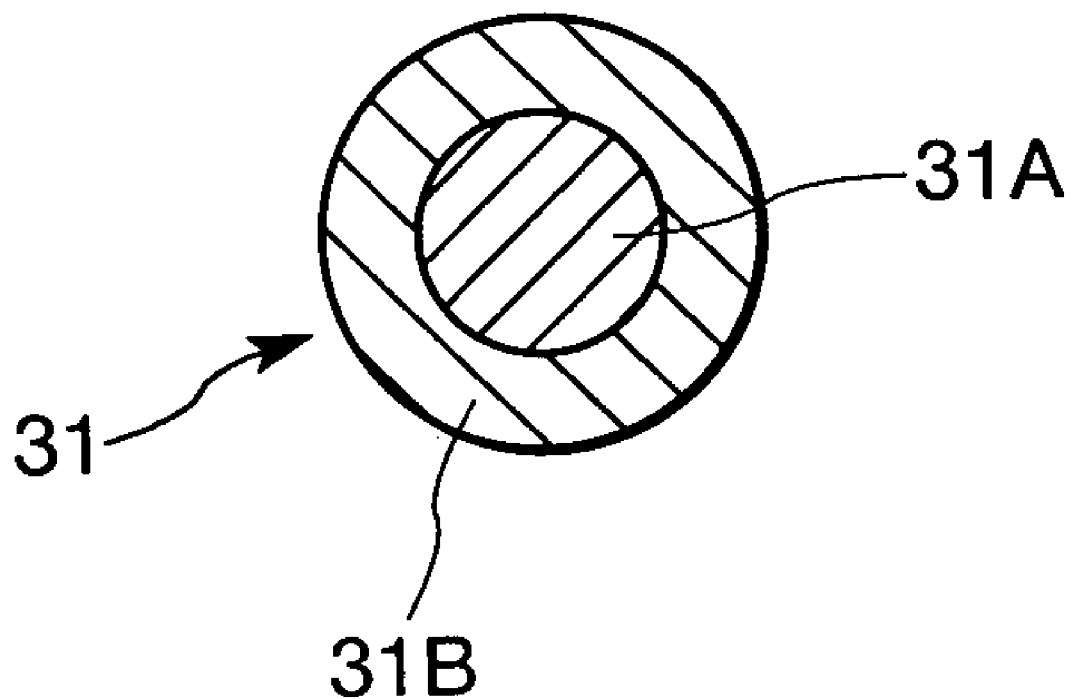
FIG. 8 is a sectional view of on electric heater.

As shown in FIG. 8, according to this embodiment, the electric heater 31 is formed by covering a resistance-heating wire 31A with an electrically insulating tube 31B. The resistance-heating wire 31A may suitably be made of a nichrome wire or a noble metal non-magnetic heating element such as platinum. The electrically insulating tube 31B may be a tube made by knitting fibrous alumina fibers, or connecting a plurality of quartz or alumina tubes. In this embodiment, the resistance-heating wire 31A is prepared by covering a nichrome wire having a diameter of from 2.0 to 2.6 mm with the tube 311B made by knitting alumina fibers, into an outside diameter of 3.5 mm.

The resistance-heating wire 31A, being placed in the magnetic field produced by the magnetic field generating device 20 as described above, is subjected to application of a force resulting from the interaction with the magnetic field caused by the current for heating, leading to contact between resistance wires, for example. Therefore, the resistance-heating wire 31A should preferably be electrically insulated with the insulating tube 31B.

In order to reduce the force resulting from the interaction, it is desirable to adopt the so-called non-inducing winding in which the flow of current of the resistance-heating wire 31A is arranged so as to cancel the resultant magnetic field.

Figure 9:
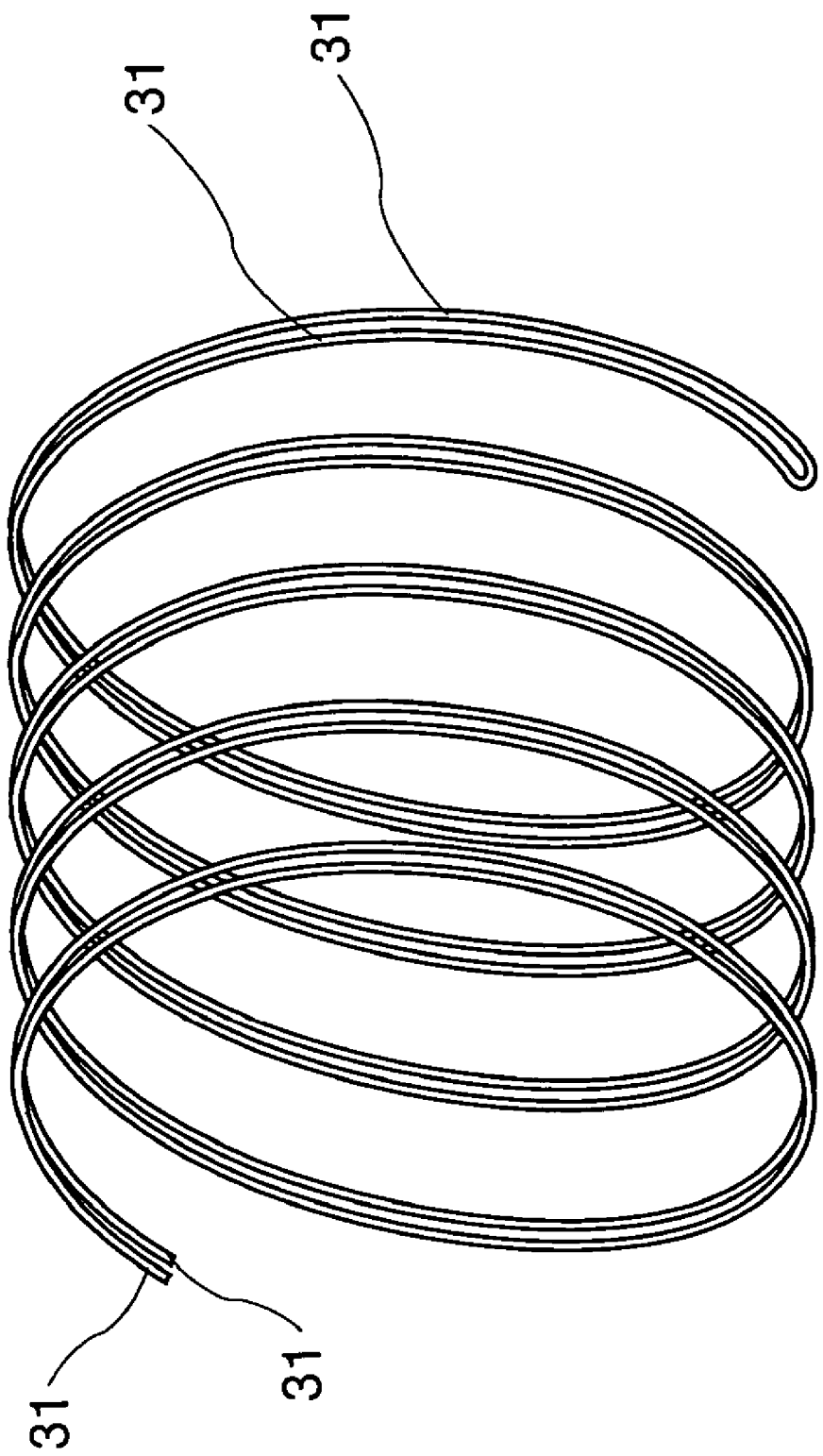
FIG. 9 is a perspective view illustrating the installing method of the electric heater.
Figure 10:
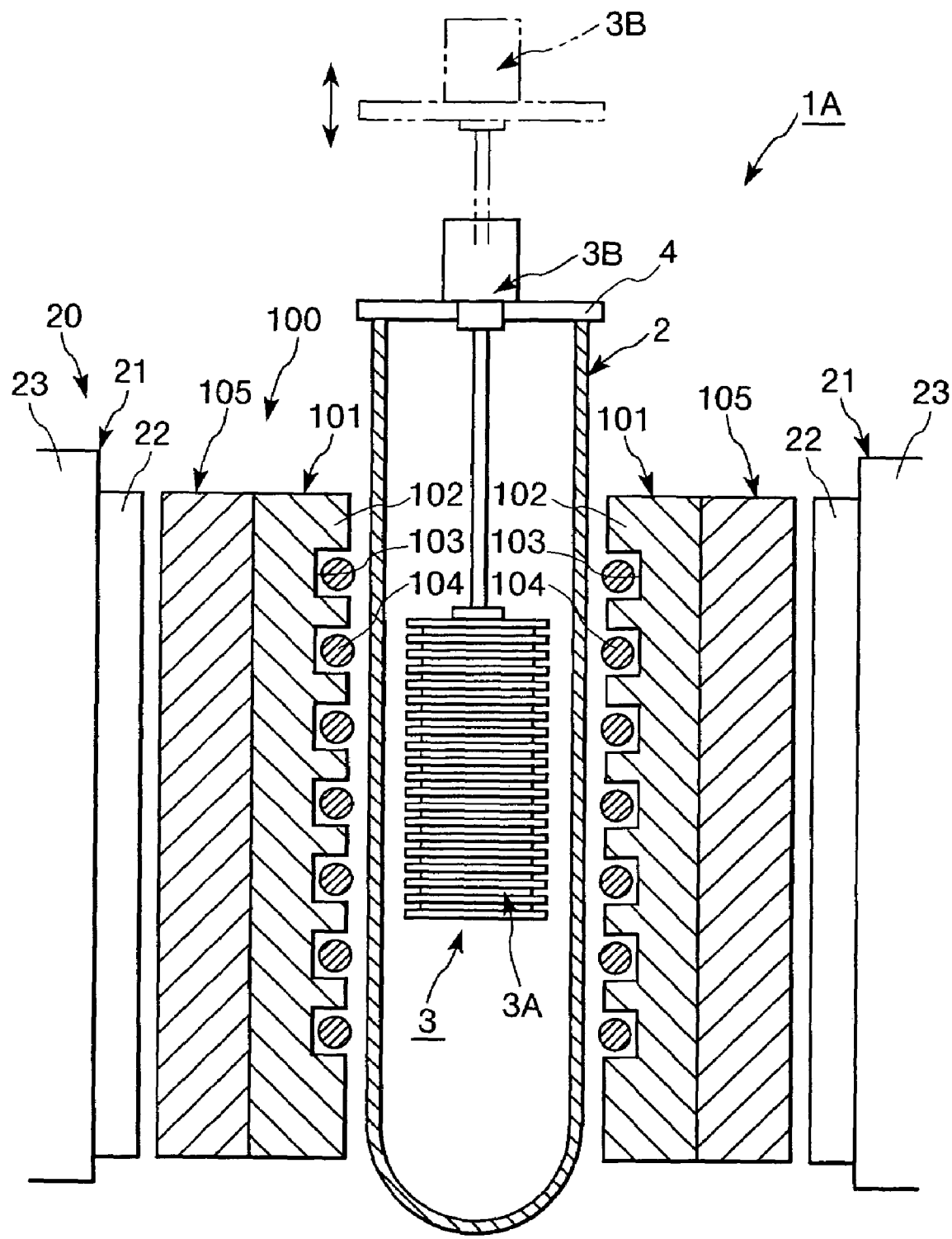
FIG. 10 is a schematic configuration sectional view of a conventional heat treatment apparatus.
Figure 11:
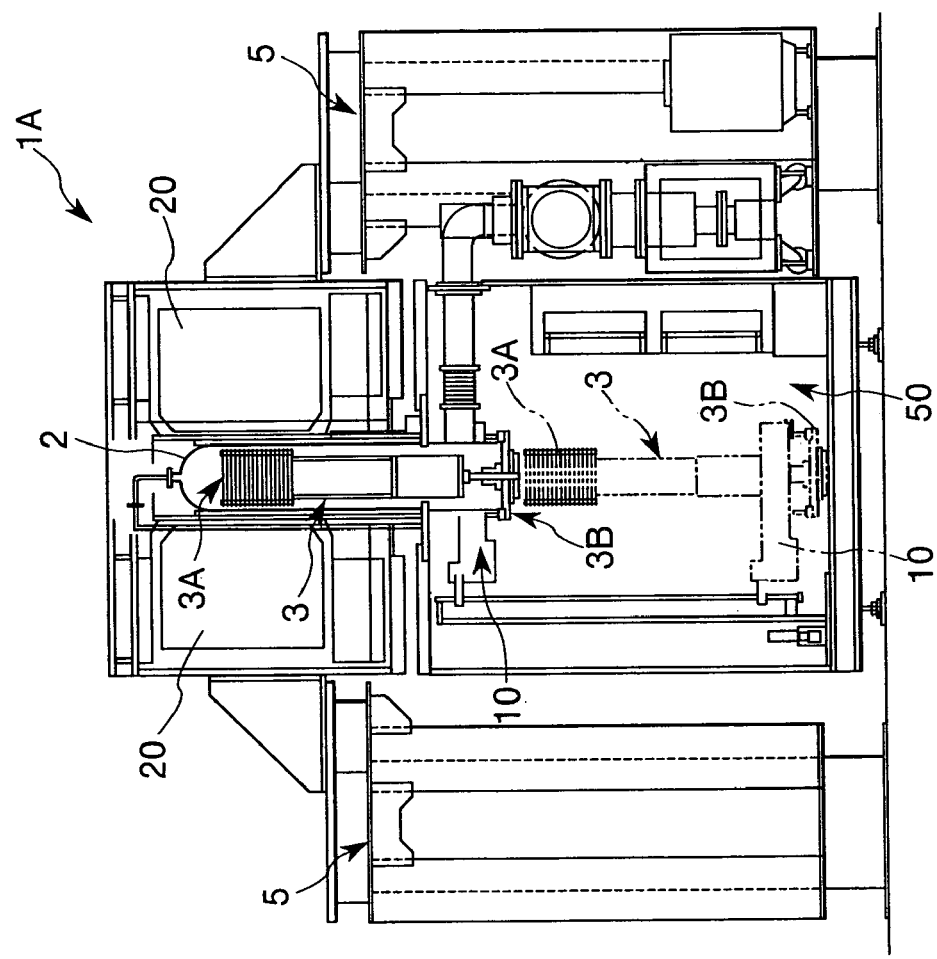
FIG. 11 is a schematic configuration sectional view of another example of conventional heat treatment apparatus.

More specifically, as shown in FIG. 9, the heater 31 is wound on the inner cylinder 32 into a single-layer winding, in a dual-wire structure in which the wire is connected at an end, i.e., in a U shape. Therefore, the directions of the current flowing through the upper and lower resistance-heating wires 31A adjacent to each other in the axial direction are counter to each other. As a result, the magnetic field generated by the current flowing through the resistance-heating wires 31A set off each other and are cancelled. If the heater 31 is made by merely winding a single wire, the magnetic field from the magnetic field generating device 20, when current flows through the resistance-heating wire 31A, applies a force onto the resistance-heating wire 31A, resulting in a shift or vibration of the heater 31, as stated above.

Further, to ensure stable cancellation of such a force, the heating current should preferably be a direct current (DC). A control device for controlling the temperature is usually provided for the heating device 30 to control the energizing of the heater 31.

Usually, the heat treatment temperature is within a range of from about 150° C. to 500° C. When heat-treating a magnetic film having a high ordering temperature of the structure of the film, however, the temperature should be specifically within a range of from about 500° C. to 800° C. When heat-treating a magnetic film for an MR device, the cooling rate should preferably be greater than or equal to 5° C./minute, or particularly, within a range of from 15° C./minute to 200° C./minute.

Under the effect of such a configuration, the inner peripheral surface temperature of the air-core coil 20A does not exceed 50° C., even in the region in which the air-core coil 20A and the heating device 30 are close to each other.

No heat insulating material should preferably be provided around the heater 31. In this embodiment, however, as the water-cooled jacket 33 is made of stainless steel, an alumina sheet 40 (FIG. 6) serving as a sheet-shaped electric insulator should preferably be arranged between the water-cooled jacket 33 and the heater 31. The alumina sheet 40 may have a thickness within a range of from about 1 to 3 mm. The electric insulator in the gap between the heater 31 and the water-cooled jacket 33 should preferably have a thickness of less than or equal to 4 mm. The heater 31 may be wound and positioned on the inner peripheral surface of the alumina sheet 40 without providing the inner cylinder 2.

As shown in FIG. 2, in the heat treatment apparatus 1 of this embodiment, it is desirable to arrange a heat reflection plate HR in the vacuum vessel 2, near the heating position where the objects of treatment held by the boats 3A are positioned, for collecting the heat from the heating device 30 onto the objects of treatment. In this embodiment, therefore, a plurality of heat reflecting plates HRa are fixedly arranged on the closed end member 2B side of the vacuum vessel 2, and a plurality of heat reflecting plates HRb are arranged adjacent to the boats 3A which compose the holding device 3. The heat reflecting plates HRb are secured to the boat supporting unit 3B.

The heat reflecting plates HRa and HRb are disks having generally the same diameter as the inside diameter of the vacuum vessel 2. About 0 to 10 such heat reflecting plates can be provided perpendicularly to the longitudinal axis line of the vacuum vessel at intervals of 10 to 50 mm along the longitudinal axis line direction. Stainless steel sheet having a thickness of 1.0 to 20 mm is applicable as a material of the plate.

In addition to the power source 20B for the magnetic field generating device 20, the aforementioned heat treatment apparatus 1 further comprises a magnetic field measuring controller, a control unit for the vacuum pump for evacuating the vacuum vessel 2, and a mechanism for controlling the operating sequence of the overall apparatus. These components may be ones well known by those skilled in the art. Detailed description thereof is therefore omitted here.

The solenoid type magnet serving as the magnetic field generating device 20 may be a direct current (DC) normal conducting type electromagnet, but a direct current (DC) superconducting magnet is preferably applicable. In some cases, it is possible to use a permanent magnet.

Although, the solenoid type magnet, i.e., the air-core coil 20A which composes the magnetic field generating device 20 has been described as being one in number, in the above-mentioned embodiment, it can be divided into a plurality of sections which are connected in series.

However, when the magnetic field generating device 20 comprises a DC superconducting electromagnet, it is necessary to cool two divided coils with separate cooling devices, respectively, and these two cooling devices must conduct quite the same cooling control. Such cooling controls of the two cooling devices require a very highly accuracy, and this is not practical. Therefore, the magnetic field generating device 20 should preferably be made of a single air-core coil 20A particularly when using a DC superconducting electromagnet.

Further, the heating device 30 has been explained in the above mentioned embodiment as being arranged outside the vacuum vessel 2, but as required, it may be installed in the vacuum vessel 2.

Operation of the present invention will now be described.

In this embodiment, the vacuum vessel 2 is attached to the lower structure 5 by using the attachments 51 and 52 as described above. At least the treatment chamber 50 in which the vacuum vessel opening and the conveying device 10 are arranged should preferably be a clean (dust-free) chamber.

In this embodiment, as will be understood from FIG. 2, the treatment chamber, i.e., the clean chamber 50 has generally a box shape, and is installed on a side of the vacuum vessel 2, the heating device 30, the magnetic field generating device 20 and the like. Therefore, the vessel attachment section 2B of the vacuum vessel 2 projects sideways into the clean chamber 50, and the vacuum vessel opening opens into the clean chamber 50.

According to this embodiment, as described above, an open end member 2C of the vacuum vessel 2, the holder supporting unit 3B, and the conveying device 10 serving as a moving device are arranged in the clean chamber 50.

In this embodiment, as shown in FIG. 4, handling means, i.e., a handling robot 60 is installed. The handling robot 60 takes out the objects of treatment one by one in cooperation with a cassette elevator 61, and transfers the same to the boats 3A supported by the boat supporting unit 3B. Since the handling robot 60 and the cassette elevator 61 operating as described above are well known by those skilled in the art, a detailed description thereof is omitted here.

While the handling robot 60 and the cassette elevator 61 can be installed in the clean chamber 50, they may also be installed in an intermediate chamber arranged adjacent to the clean chamber 50 via a opening capable of being sealed.

After the completion of transfer of the objects of treatment to the boats 3A, the conveying device 10 is driven to horizontally move the boat supporting unit 3B and the boats 3A to charge the same into the vacuum vessel 2 from a side. The opening of the vacuum vessel 2 is closed by the closed cover 14 disposed on the conveying device 10.

Subsequently, the interior of the vacuum vessel 2 is evacuated to reduce the pressure therein, and the interior of the vacuum vessel 2 is filled with a non-oxidizing atmosphere. Then, the power source 20B of the magnetic field generating device 20 is turned on, and the power source of the heating device 30 is also turned on. A heat treatment is thus applied to the objects of treatment S supported by the boats 3A.

On the other hand, according to this embodiment, the clean chamber 50 is in a hermetically closed state and in vacuum, while the opening of the vacuum vessel 2 is closed. As required, a prescribed atmosphere in the chamber is set.

More specifically, in this embodiment, since the object of treatment is a magnetic material such as an MR film or a GMR film, which is deteriorated by an open-air atmosphere at a treating temperature higher than room temperature, the interior of the clean chamber 50 is set to contain a non-oxidizing atmosphere of such as nitrogen or argon. Therefore, the interior of the clean chamber 50, after evacuation to below 1 Pa, is filled with nitrogen gas, in this embodiment, to achieve a nitrogen gas atmosphere at room temperature with a pressure of 1 atm (0.1 MPa). Alternatively, the interior of the clean chamber 50 may be left in vacuum state. As the condition of atmosphere in the clean chamber 50, a desired gas, a desired chamber temperature, a desired pressure and the like may be selected as required.

After achieving the non-oxidizing atmosphere state in the clean chamber 50, the vacuum state in the vacuum vessel 2 is released by introducing nitrogen gas into the vacuum vessel 2 via a valve (not shown), and the boat supporting unit 3B and the boats 3A are moved sideways from the side opening of the vacuum vessel by driving the conveying device 10.

The interior of the clean chamber 50 is kept in a non-oxidizing atmosphere state at the room temperature, thus allowing the heat-treated objects of treatment to be rapidly cooled without suffering from deterioration.

Thereafter, the treated objects S supported by the boats 3A are transferred to a prescribed position by means of the handling robot 60, and the objects of treatment to be treated next which are housed in the cassette are transferred to the boats 3A.

Subsequently, the treatment operation for the next batch is started in the above-mentioned procedure.

INDUSTRIAL APPLICABILITY

According to the present invention, as described above, there is provided a heat treatment apparatus comprising a holding device which holds an object of treatment, a heat treatment vessel which houses the object of treatment held by the holding device, a conveying device which conveys the holding device together with the object of treatment into the heat treatment vessel, a heating device which heats the object of treatment, and a magnetic field generating device which impresses a magnetic field onto the object of treatment; wherein the direction of the magnetic field generated by the magnetic field generating device in a region in which the object of treatment is heat-treated and the conveying direction of the conveying device in which the object of treatment is conveyed into the heat treatment vessel are in parallel with each other, and are in parallel with the horizontal direction of the entire heat treatment apparatus; and wherein the object of treatment is heat-treated with the main surface thereof arranged in parallel with the direction of the magnetic field generated by the magnetic field generating device in the heat treatment region. Since the apparatus has such a configuration, it is possible to simplify the configuration of the magnetic field generating device by using a compact solenoid type magnet (air-core coil) as the magnetic field generating device, thereby permitting saving of the weight and height of the apparatus, reducing the installation area to the same order as the conventional one, achieving an apparatus installable in a usual clean room, and treating a large quantity of large-sized objects of treatment as compared with the conventional art.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

I claim:

1. A heat treatment apparatus comprising a holding device which holds an object of treatment which is a magnetic material, a generally horizontal heat treatment vessel which houses the object of treatment held by the holding device, a conveying device which conveys the holding device together with the object of treatment into the heat treatment vessel, a heating device which heats the object of treatment, and a magnetic field generating device which impresses a magnetic field onto the object of treatment wherein:

the heat treatment vessel has a horizontally extending outer peripheral surface;

the magnetic field generating device is a DC electromagnet having an air core coil which is wound around the heat treatment vessel so as to surround the outer peripheral surface of the heat treatment vessel;

the direction of the magnetic field generated by the magnetic field generating device in a region in which the object of treatment is heat-treated and the conveying direction of the conveying device in which the object of treatment is conveyed into the heat treatment vessel are in parallel with each other, and are in parallel with the horizontal direction of the entire heat treatment apparatus; and the heat treatment is carried out so that the main surface of the object of treatment is in parallel with the direction of the magnetic field generated by the magnetic field generating device in the heat treatment region.

2. The heat treatment apparatus according to claim 1, wherein the object of treatment is one which deteriorates in an open-air atmosphere at a heat treatment temperature, and the heat treatment vessel can be set to contain a non-oxidizing atmosphere.

3. The heat treatment apparatus according to claim 1, wherein the heating device is arranged so as to surround the heat treatment vessel.

4. The heat treatment apparatus according to claim 1, wherein the heating device is an electric heater having a dual-wire structure, so that the magnetic field generated from the electric heater does not inhibit the magnetic field generated by the magnetic field generating device.

5. The heat treatment apparatus according to claim 1, wherein the DC electromagnet is comprised of one of a DC normal conducting type electromagnet and a DC superconducting type electromagnet.

6. The heat treatment apparatus according to claim 1, wherein a cooling device is provided between the magnetic field generating device and the heating device, so that the surface temperature of the magnetic field generating device in the region in which the magnetic field generating device and the heating device are close to each other does not exceed 50° C.

* * * * *